United States Patent [19]
Leitch

[11] Patent Number: 5,066,922
[45] Date of Patent: Nov. 19, 1991

[54] STABILIZING CIRCUIT FOR FEEDBACK RF AMPLIFIER

[75] Inventor: Clifford D. Leitch, Coral Springs, Fla.

[73] Assignee: Motorola, Inc., Schaumburg, Ill.

[21] Appl. No.: 686,852

[22] Filed: Apr. 18, 1991

Related U.S. Application Data

[63] Continuation of Ser. No. 422,267, Oct. 16, 1989, abandoned.

[51] Int. Cl.[5] .............................................. H03F 1/26
[52] U.S. Cl. .................................... 330/51; 330/149; 330/151; 330/207 P; 455/117; 455/126
[58] Field of Search .............. 330/51, 149, 151, 207 P, 330/298; 332/103, 105; 375/60; 455/114, 117, 126

[56] References Cited

U.S. PATENT DOCUMENTS

| | | | |
|---|---|---|---|
| 3,900,823 | 8/1975 | Sokal et al. | 330/149 |
| 4,367,443 | 1/1983 | Hull et al. | 330/149 X |
| 4,439,741 | 3/1984 | Turner, Jr. | 330/284 X |
| 4,673,886 | 6/1987 | Bickley et al. | 455/117 X |
| 4,933,986 | 6/1990 | Leitch | 455/119 |

FOREIGN PATENT DOCUMENTS 1246209 9/1971 United Kingdom ................ 330/149

Primary Examiner—James B. Mullins
Attorney, Agent, or Firm—Michael J. Buchenhorner

[57] ABSTRACT

A transmitter, with an inphase input for receiving an inphase baseband input signal, and a quadrature input for receiving a quadrature baseband input signal, comprises a modulator, coupled to the inphase and quadrature inputs, for modulating the inphase and quadrature baseband signals to provide a modulated radio-frequency signal and a linear amplifier, coupled to the modulator, for amplifying the modulated radio-frequency signal to produce an output signal. Oscillation detector means are coupled to receive the output signal, for detecting oscillation, and for producing an error signal as a result of the oscillation. The transmitter also comprises means for reducing the open loop gain of the feedback loop, disposed between the inphase and quadrature inputs and the modulator. The means for reducing the open loop gain reduces the open loop gain of the transmitter to less than one, in response to the error signal.

12 Claims, 4 Drawing Sheets

5,066,922

STABILIZING CIRCUIT FOR FEEDBACK RF AMPLIFIER

This is a continuation of application Ser. No. 07/422,267, filed Oct. 16, 1989 and now abandoned.

TECHNICAL FIELD

This invention relates generally to spectrally efficient digital modulation systems and more particularly to stabilizing circuits for feedback radio-frequency (RF) amplifiers.

BACKGROUND

A linear RF amplifier is an amplifier that increases the power of a modulated carrier signal while preserving both the amplitude and phase modulation components of the the signal. Frequency-modulation (FM) signals have constant amplitude and thus do not require linear amplification. On the other hand, digital transmission systems may require both amplitude modulation (AM) and phase modulation (PM) of the transmitted signals. Linear amplifiers are necessary to transmit those signals.

Linear RF amplifiers typically have inherent defects, including amplitude distortion and AM-to-PM conversion, which may cause undesired interference called splatter, to adjacent channel signals. Negative feedback, as well as careful amplifier design, is required to minimize the level of splatter generated.

Linear RF amplifiers commonly use feedback to minimize the splatter. For stability (i.e., freedom from oscillation) a feedback loop must have a gain/phase versus frequency characteristic such that the open loop gain (i.e., the gain of the entire feedback loop with the loop broken at one point) is less than one at all frequencies where the phase shift is more than 180 degrees different from that at midband. Previous RF feedback loops have used a very high Q (i.e., the merit factor of the loop) resonant circuit at the radio-frequency to achieve this condition. This approach has several disadvantages, including large size, large RF gain needed, and the limited amount of open loop gain possible.

Stability of the feedback loop is a major concern. The baseband portions of the loop can be made to have well controlled phase characteristics, but the RF portion may have large, unpredictable phase shifts due to resonant circuits, varactor effects of supply voltage variations, AM-to-PM conversion, thermal effects and aging effects. These effects substantially reduce the phase margin for stability of the loop, and may even cause oscillation of the amplifier.

SUMMARY OF THE INVENTION

Briefly, a linear amplifier includes a feedback loop for providing a feedback signal. The linear amplifier also includes feedforward and feedback phase correction means.

DETAILED DESCRIPTION OF THE PREFERRED EMBODIMENT

Figure 1:
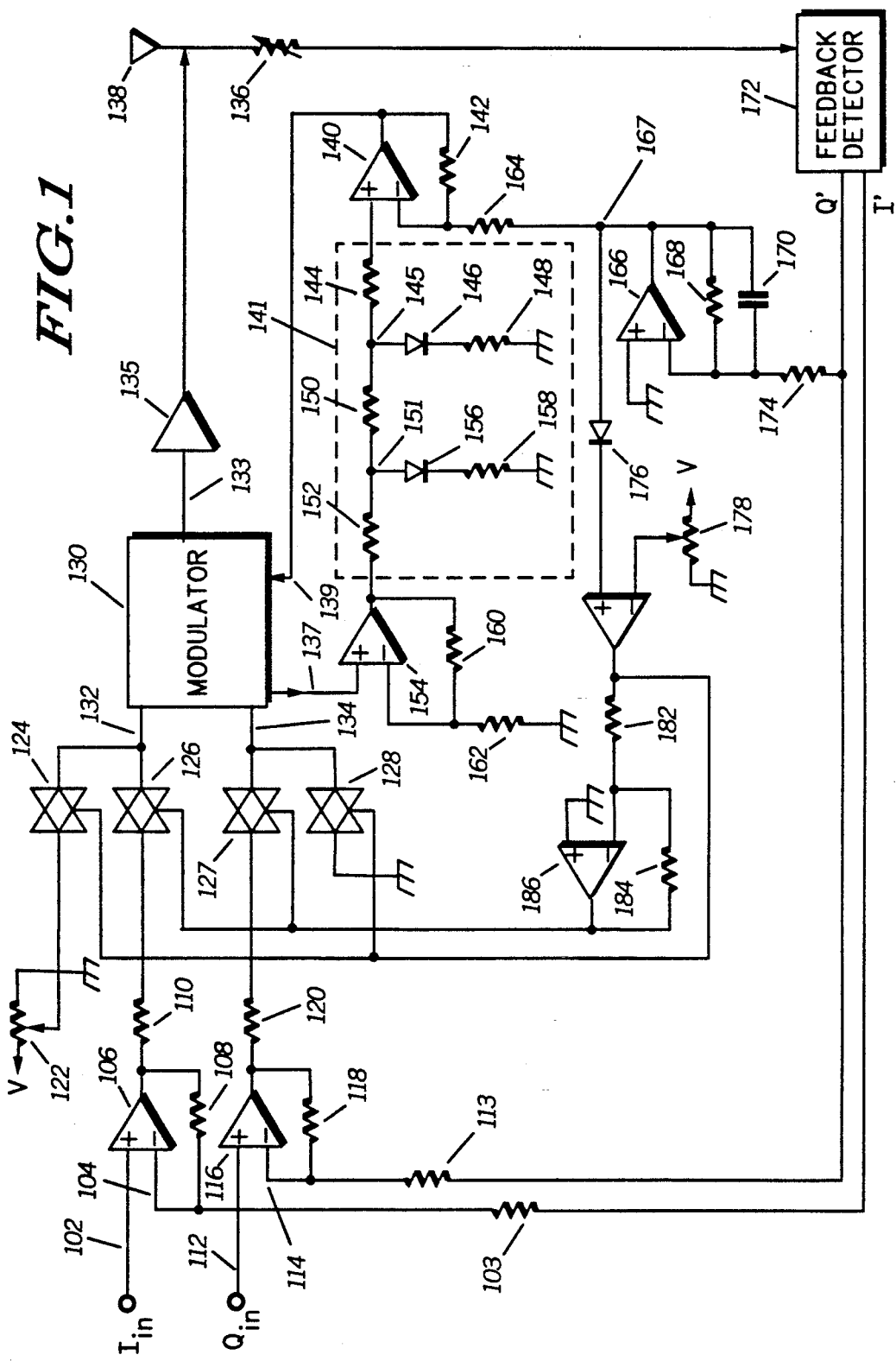
FIG. 1 shows a transmitter, with feedforward and feedback circuits, in accordance with the present invention.

Referring to FIG. 1, a transmitter 100, with a conventional linear amplifier 135 and feedforward and feedback circuits, is shown. A baseband feedback loop is shown, but the innovations of the present invention are not limited thereto, but may also be applicable to feedback of radio frequency and other signals. The baseband feedback loop accepts an inphase baseband input signal ($I_{in}$) and a quadrature baseband input signal ($Q_{in}$). The $I_{in}$ signal is applied to the positive input 102 of a conventional operational amplifier 106. The amplifier 106 amplifies the difference between the input signal $I_{in}$ and the signal at its negative input 104 and acts as an input buffer for $I_{in}$. The output of the amplifier 106 is coupled to I', through a resistor 108, and to a terminal of a transmission gate 126 (operating as a normally-closed switch), through a resistor 110. The other terminal of the transmission gate 126 is coupled to the inphase input 132 of a conventional amplitude modulator 130. A resistor 103 is disposed between the negative input 104 of the amplifier 106 and the inphase output of a feedback detector 172 (having inphase and quadrature outputs). Similarly, a resistor 113 is disposed between the negative input 114 of the amplifier 116 and the quadrature output of the feedback detector 172.

The quadrature signal $Q_{in}$ is applied to the positive input 112 of an operational amplifier 116. The amplifier 116 operates in substantially the same manner as the amplifier 106. Moreover, the output of the amplifier 116 is coupled to its negative input 114, through a resistor 118, and it is also coupled to a transmission gate 127 (also operating as a normally-closed switch) through a resistor 120. The other terminal of the transmission gate 127 is coupled to the quadrature input 134 of the modulator 130.

A transmission gate 124 (operating as a normally-open switch) is disposed between an adjustable power supply 122 and the inphase input 132 of the modulator 130. Another transmission gate 128 (operating as a normally-open switch) is disposed between ground potential and the quadrature input 132 of the modulator 130.

The modulator 130 mixes the signals ($I_{in}$) and ($Q_{in}$) up to radio-frequency, and the linear amplifier 135 amplifies the resulting modulated low power RF signal 133 to provide an output signal 143 for transmission by an antenna 138. A sample of the RF output 143 is mixed back down to baseband frequency by the feedback detector 172, to produce detected inphase and quadrature baseband signals, I' and Q', respectively. An attenuator 136 is disposed between the output of the the linear amplifier 135 and the input of the feedback detector 172, so that the power level of the feedback is lower than that of the output signal. The I' and Q' baseband signals are applied to the negative inputs (104 and 114) of the amplifiers 106 and 116, respectively, to be combined, out of phase, with the the input signals ($I_{in}$) and ($Q_{in}$); thus forming a negative feedback loop around the linear amplifier 135.

Assuming that a carrier component is always present in the transmission, it can be used as a phase reference signal for the amplifier 135. Thus, the Q' output of the feedback detector 172 may operate as a phase detector.

This is because the carrier signal, at baseband, is a DC voltage on the inphase (I') channel only. Any DC voltage at the Q' output of the detector 172 is proportional to sin ($\phi$), where $\phi$ is the phase error in the RF amplifier 135. The resulting error voltage is applied to the negative input of the amplifier 140, through the resistor 164. The amplifier 140 combines the feedback (error) and feedforward signals and applies the combined signal 139 to a phase shifter 218 (as will become more apparent in the discussion of FIG. 2). The combined signal 139 causes the phase shifter 218 to shift the phase of the modulated signal 133 to compensate for any shift in the phase of the output signal 143.

The modulator 130 includes a conventional envelope detector (216, shown in FIG. 2) providing an output signal 137 to the positive input of a conventional operational amplifier 154. The operational amplifier 154 has its output coupled to its negative input, through a resistor 160, and its negative input also coupled to ground, through a resistor 162. The amplifier 154, and the resistors 160 and 162 operate as a buffer from the envelope detector signal 137.

Figure 2:
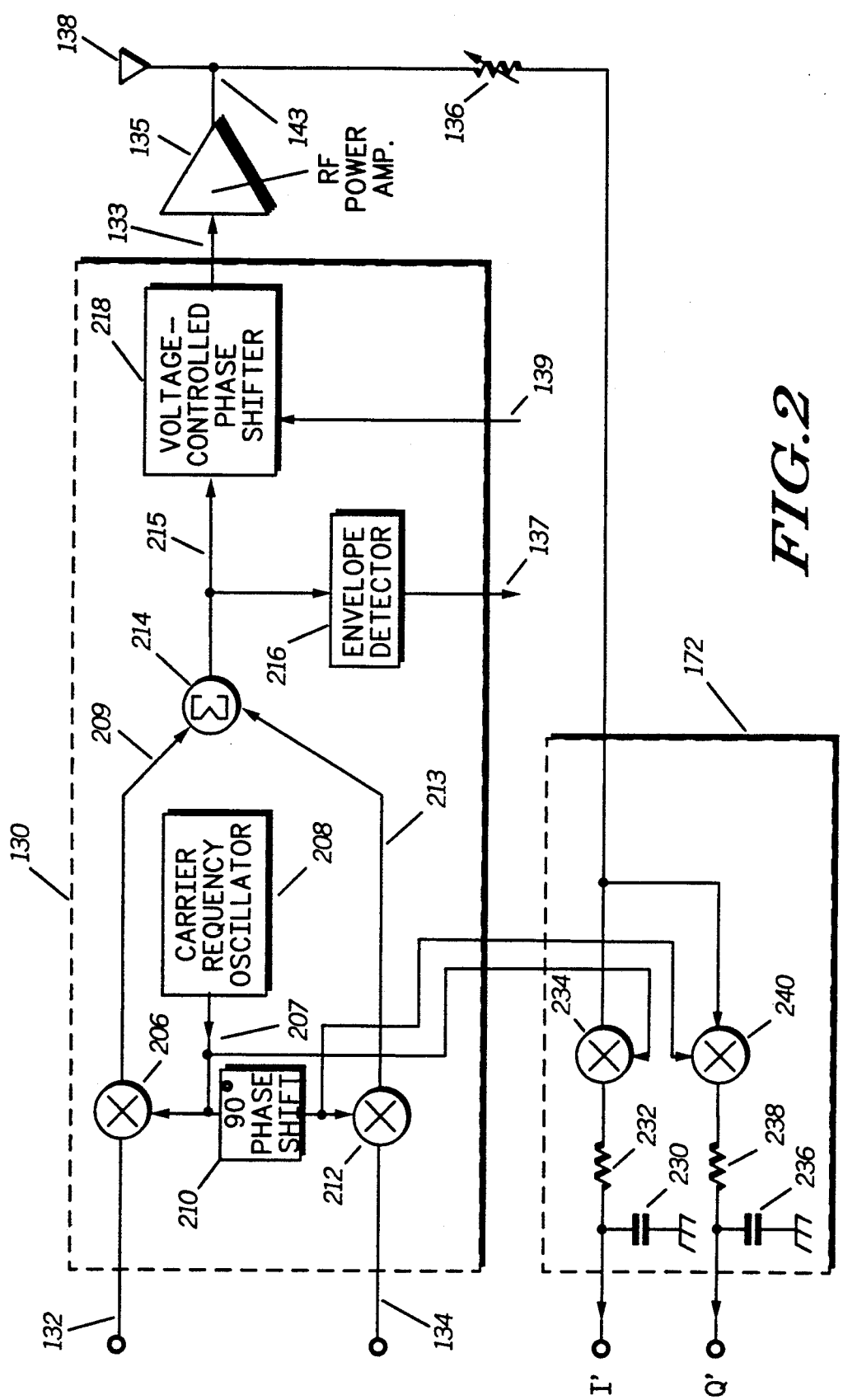
FIG. 2 shows the modulator, amplifier and feedback detector of FIG. 1 in greater detail.

Conventional operational amplifiers 166 and 140 are loop filters and amplifiers to drive a voltage controlled phase shifter (218, shown in FIG. 2). These elements together with the Q' detector form the equivalent of a phase locked loop which corrects any slowly varying phase effects (e.g., supply voltage, resonant circuits, and thermal effects) in the RF amplifier 135 (i.e., a feedback phase corrector). The amplifier 166, with its positive input grounded and its output coupled to the node 167, also operates as a low-pass filter and amplifier. The output of the amplifier 166 is coupled to its negative input, through a resistor 168 in parallel with a capacitor 170, and to the quadrature output of the feedback detector 172, through a resistor 174.

Amplitude to phase modulation (AM to PM) conversion can be compensated for by a nonlinear feedforward correction circuit. The feedforward correction circuit comprises the amplifier 154, a nonlinear network 141 (that includes diodes 156 and 146). The nonlinear network 141 has the following structure. A resistor 152 has a terminal coupled to the output of the amplifier 154. The other terminal of the resistor 152 is coupled to the anode of a diode 156 at a node 151. A resistor 158 is disposed between the cathode of the diode 156 and ground potential and a resistor 148 is disposed between the cathode of the diode 146 and ground. A resistor 150 is coupled between the node 151 and a node 145. The anode of a diode 146 is coupled to the node 145. A resistor 144 is disposed between the node 145 and the positive input of the amplifier 140. The output of the amplifier 140 is also coupled to its negative input, through a resistor 142. The negative input of the amplifier 140 is coupled to a node 167, through a resistor 164.

The output of the amplifier 154 represents the instantaneous AM component of the signal 133. It is applied to the phase shifter 218 through a nonlinear network 141 and the amplifier 140. The characteristics of the nonlinear network 141 are selected to approximately cancel the AM to PM conversion characteristic of the amplifier 135. The combination of feedforward and feedback phase correction allows a greater degree of phase correction than is possible with either method alone.

A diode 176 has its anode coupled to the node 167, and its cathode coupled to the positive input of a conventional operational amplifier 180. The operational amplifier 180, with its negative input coupled to an adjustable power supply 178, detects any low frequency oscillation of the feedback loop. The output of the amplifier 180 is coupled to the negative input of a conventional operational amplifier 186, through a resistor 182, and to the control terminal of the transmission gates 124 and 128. The amplifier 180 also has its positive input coupled to ground. The output of the amplifier 186 is coupled to its negative input through a resistor 184. Thus the amplifier 186 inverts the output of the amplifier 180. The output of the amplifier 186 is applied to the control terminal of the transmission gates 126 and 127. In case oscillation is detected, the detector 180, and the inverter 186 switch the transmission gates 126 and 127 off, while switching the transmission gates 124 and 128 on. This opens the feedback loop (to stop oscillation) and applies a DC signal to the inphase input 132 and grounds 134 of the modulator 130 to reestablish correct carrier phase. After this, the transmitter 100 will stabilize.

According to another embodiment of the present invention, transmission gates can be replaced by a commercially available voltage controlled attenuator to attenuate the output signals from the amplifiers 106 and 116, respectively, at times when the amplifier 180 detects an error signal indicating that oscillation exists in the feedback loop, thus eliminating the oscillation since the gain of the loop has been reduced to below unity.

Referring to FIG. 2, the modulator 130 and the feedback detector 172 of FIG. 1 in are shown in greater detail. The modulator 130 comprises an inphase modulator 206 that receives the inphase input signal 132 and mixes that signal with a carrier-frequency signal 207 provided by a carrier-frequency oscillator 208 to produce a first mixed signal 209.

The quadrature input signal 134 is applied to a mixer 212 for multiplication by the signal 207, shifted (210) by 90 degrees, to produce a second mixed signal 213. The first and second mixed signals 209 and 213 are added by an adder 214, to produce a signal 215. An envelope detector 216 samples the signal 215 to provide the feedforward signal 137. A voltage-controlled phase shifter 218 shifts the phase of the modulated signal 215 in response to the combined signal 139, to compensate for phase shifts in the output signal 143 and produce the signal 133.

The feedback detector 172 comprises a multiplier 234 that multiplies the sampled signal 143 (attenuated by the attenuator 136) and the signal 207, produced by the carrier frequency oscillator 208. The resulting product is then filtered by a low-pass filter (consisting of a series resistor 232 and a capacitor 230 coupled to ground), thus producing the detected inphase signal (I').

The feedback detector 172 further comprises a multiplier 240 that multiplies the sampled signal 143 (attenuated by the attenuator 136) and the signal 207, phase shifted by 90°). The resulting product is then filtered by a low-pass filter (consisting of a series resistor 238 and a capacitor 236 coupled to ground), thus producing the detected quadrature signal (Q').

Figure 3:
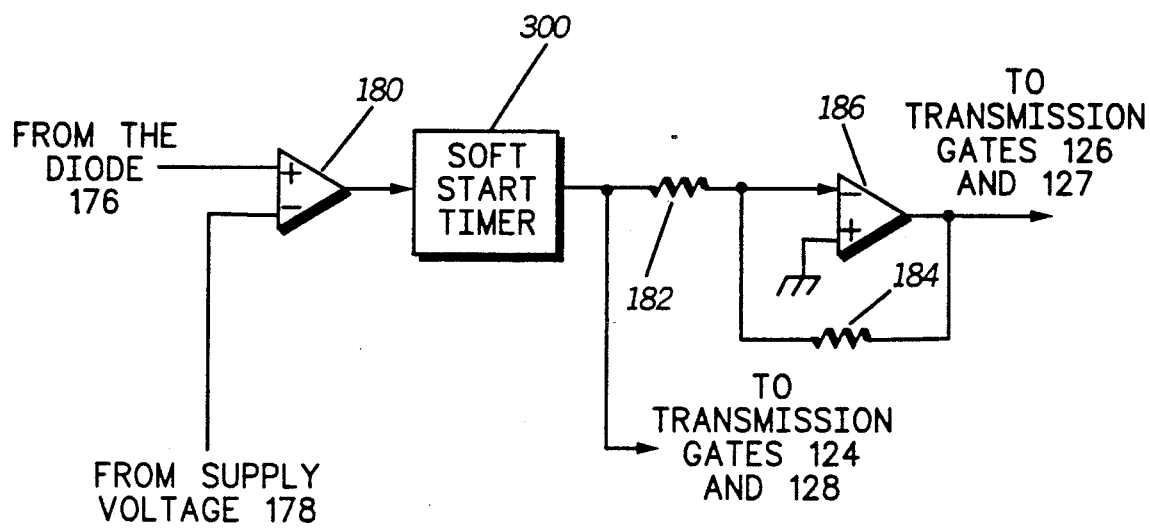
FIG. 3 shows a soft start circuit that may be used within the circuit of FIG. 1.

Referring to FIG. 3, a conventional timer 300 is shown used as a "soft start" circuit. The soft start timer 300 is disposed between the amplifier 180 and the amplifier 186. It is used to prevent oscillation when the transmitter 100 is turned on by causing the transmission gates 126 and 127 (shown in FIG. 1) to attenuate the outputs of the amplifiers 106 and 116, respectively, for a short period of time when the transmitter 100 is first turned on (i.e., at startup). Alternatively, the soft start timer 300 could cause the transmitter to operate on a carrier-only mode (i.e., transmission gates 126 and 127 are open while 124 and 128 are closed) at startup, thus preventing oscillation. Normal operation would begin after a predetermined time or when the amplifier 180 indicates that a normal phase condition has been established (i.e., that there is no oscillation).

Figure 4:
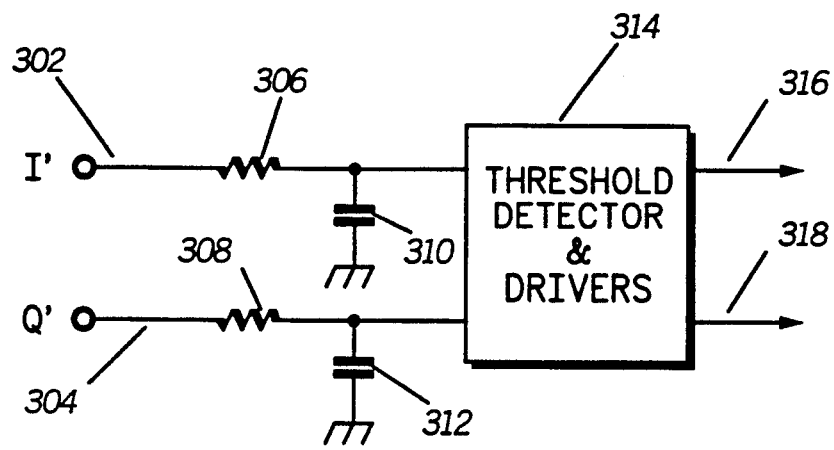
FIG. 4 shows a possible means for detecting oscillation.

Referring to FIG. 4, an alternate means for detecting oscillation is shown. This detects not only high amplitude at Q', but also abnormally low amplitude carrier level at I', which would indicate saturation of the amplifier by oscillator. Conventional threshold detectors and drivers 314 receive the detected I' and Q' signals (filtered through the low pass filters consisting of series resistors 306 and 308 and capacitors 310 and 312). An abnormally low DC component at I' indicates that the carrier is being suppressed by oscillation. An abnormally high amplitude low frequency component at Q' also indicates oscillation. In addition, current drawn by the amplifier or the RF output voltage, if greater than normal, could serve as an indication of oscillation.

Figure 5:
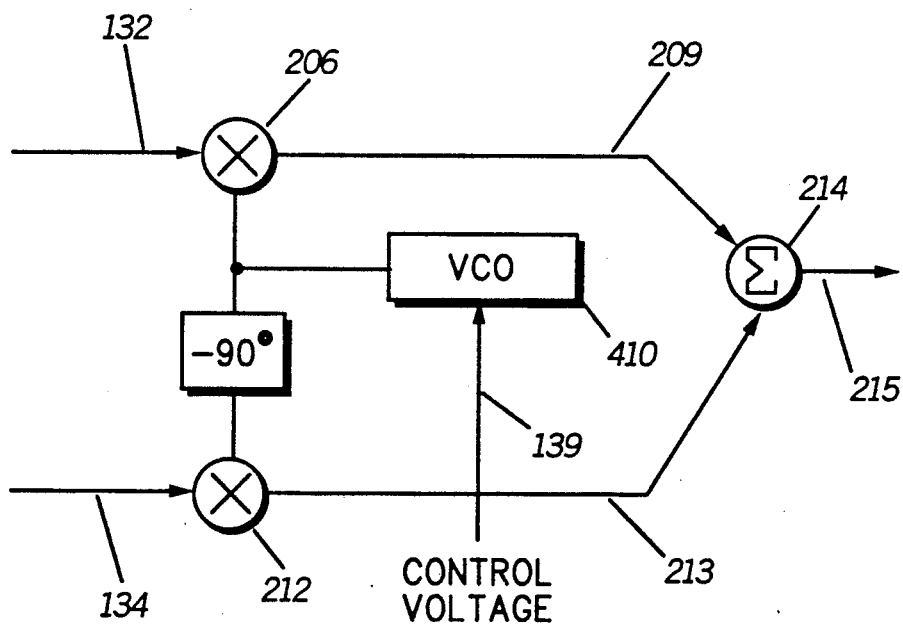
FIG. 5 shows an alternative configuration for implementing the voltage controlled phase shifter.

Referring to FIG. 5, an alternative configuration for the phase shifting means of the transmitter 100 is shown. If desired, separate oscillators could be used to drive the I and Q modulators (130) and the I and Q feedback detector (172), and the oscillator 410 driving the modulators (130) could be used as a VCO replacing the voltage controlled phase shifter 218 of FIG. 2.

When the amplifier 135 is first turned on, it could start oscillating before the feedback phase corrector can establish the correct phase relationship. In addition, an external event such as a sudden change in RF load impedance could cause a rapid phase change which would start an oscillation. The present invention provides means to detect and eliminate any such oscillation. According to the present invention, there are several possible means to detect an oscillation:

1. If the frequency of oscillation is expected to be within the bandwidth allocated to the carrier, then a high amplitude signal at the Q' output of the feedback detector 172 will indicate oscillation.

2. As discussed with respect to FIG. 4, a more general method is to introduce threshold detectors and drivers between the I' and Q' outputs of the detector 172, and the gain control elements. This method detects not only high amplitude at Q' but also abnormally low amplitude carrier level at I' which would indicate saturation of the amplifier by oscillation.

3. Abnormally high DC current drain and/or RF output voltage could also be used as an indication of oscillation. These methods do not depend on a carrier component being present. When oscillation is detected, the present invention operates to use one or more of the following methods to stop the oscillation and restore normal operation.

In FIG. 1, when an oscillation is detected transmission gates 126 and 127 are opened. This breaks the feedback loop and immediately stops the oscillation. At the same time, a DC component is applied to the in phase modulator input 132 through transmission gate 124 and zero volts applied to the quadrature modulator input 134 through transmission gate 128. This inserts a carrier component with the proper phase and will allow the feedback phase corrector to establish the correct phase relationship while the loop is open. Once the phase is corrected, the loop can be automatically closed and normal operation will follow.

As an alternative to opening the loop and inserting carrier, the transmission gates can be arranged to merely insert a predetermined amount of attenuation in the forward path. This attenuation would reduce the loop gain sufficiently to stop oscillation and allow the correct phase to be reestablished. As before, normal operation would then ensue.

As an alternative to having attenuators in the forward I and Q paths, a single attenuator could be used in the forward RF path to accomplish the same purpose. This could be accomplished with a PIN diode attenuator or other means. In summary, the present invention provides a transmitter with negative feedback in which oscillation may be prevented or eliminated by reducing the open loop gain of the transmitter (possibly to zero, by opening the loop and inserting the carrier) alone or in combination with other methods discussed herein.

What is claimed is:

1. A linear amplifier for receiving an input signal and producing an output signal, comprising:
   a feedback loop for providing a feedback signal;
   feedforward phase correction means comprising a nonlinear network with a characteristic selected to approximately cancel the AM to PM conversion characteristic of the linear amplifier;
   feedback phase correction means comprising phase detection means for detecting a difference between the phase of the feedback signal and the phase of the input signal; and,
   a voltage-controlled phase shifter for correcting slowly-varying phase effects.

2. The linear amplifier of claim 1 further comprising means for stopping oscillation in the linear amplifier when the phase detection means detects a difference between the phase of the feedback signal and the phase of the input signal.

3. A linear amplifier, with a feedback loop, for receiving an input signal and producing an output signal, comprising:
   detection means for detecting oscillation in the linear amplifier; and
   a soft start circuit to force the open loop gain of the feedback loop to be less than one for a period of time beginning at startup, to prevent oscillation from occurring before a normal phase relationship has been established in the linear amplifier.

4. A transmitter, with an inphase input for receiving an inphase baseband input signal, and a quadrature input for receiving a quadrature baseband input signal, comprising:
   a modulator, coupled to the inphase and quadrature inputs, for modulating the inphase and quadrature baseband signals to provide a modulated radio-frequency signal;
   a linear amplifier, coupled to the modulator, for amplifying the modulated radio-frequency signal to produce an output signal;
   oscillation detector means, coupled to receive the output signal, for detecting oscillation, and for producing an error signal as a result of the oscillation; and
   means for reducing the open loop gain of the feedback loop to less than one, in response to the error signal.

5. The transmitter of claim 4 wherein the oscillation detector means produces a detected baseband inphase signal and a detected baseband quadrature signal, the detected baseband quadrature signal comprising the error signal, and wherein the transmitter further comprises:

inphase feedback combiner means, coupled to the oscillation detector means to receive the detected baseband inphase signal, and coupled to receive the inphase baseband input signal, for combining the detected baseband inphase signal signal with the inphase baseband input signal, to provide an inphase difference signal to the means for reducing the open-loop gain; and quadrature feedback combiner means, coupled to the oscillation detector means to receive the detected baseband quadrature signal, for combining the detected baseband quadrature signal with the quadrature baseband input signal to provide a quadrature difference signal to the means for reducing the open-loop gain.

6. The transmitter of claim 5 wherein the means for reducing the open-loop gain comprises:

a first normally-closed switch disposed between the inphase feedback combiner means and the modulator, the first normally-closed switch also having a control electrode coupled to receive the error signal so that the first normally-closed switch opens when it receives the error signal and is closed when the error signal is not applied thereto;

a first normally-open switch disposed between a supply of direct-current voltage and the modulator, the first normally-open switch also having a control electrode coupled to receive the error signal so that the first normally-open switch closes when it receives the error signal and is open when the error signal is not applied thereto;

a second normally-closed switch disposed between the quadrature feedback combiner means and the modulator, the second normally-closed switch also having a control electrode coupled to receive the error signal so that the first normally-closed switch opens when it receives the error signal and is closed when the error signal is not applied thereto; and a second normally-open switch disposed between a ground voltage and the modulator, the first normally-open switch also having a control electrode coupled to receive the error signal so that the second normally-open switch closes when it receives the error signal and is open when the error signal is not applied thereto.

7. The transmitter of claim 6, wherein the inphase and quadrature combiner means comprise operational amplifiers.

8. A transmitter, having input means for receiving inphase and quadrature baseband input signals, comprising:

a modulator, coupled to the input means, for providing a modulated radio-frequency signal;

a linear amplifier, coupled to the modulator, for amplifying the modulated radio-frequency signal to produce an output signal;

detection means for detecting oscillation in the transmitter and for producing detected baseband inphase and quadrature feedback signals and applying the feedback signals to the input means an inphase feedback combiner, coupled to the feedback detector for combining the inphase feedback signal with the inphase input signal, to provide an inphase difference signal, a quadrature feedback combiner, coupled to the feedback detector for combining the quadrature feedback signal with the quadrature input signal to provide a quadrature difference signal;

an inphase attenuator, coupled to the inphase feedback combiner, for reducing the open loop gain of the feedback loop, in response to the quadrature feedback signal; and a quadrature attenuator, coupled to the quadrature feedback combiner, for reducing the open loop gain of the feedback loop, in response to the quadrature feedback signal.

9. A transmitter, with an inphase input for receiving an inphase baseband input signal, and a quadrature input for receiving a quadrature baseband input signal, comprising:

a modulator, coupled to the inphase and quadrature inputs, for providing a modulated signal and a feedforward signal representing the instantaneous amplitude of the modulated signal;

a linear amplifier, coupled to the modulator, for amplifying the modulated signal to produce an output signal;

a phase detector, coupled to receive the output signal, for detecting phase error in the output signal and for producing detected baseband inphase and quadrature feedback signals, and an error signal as a result of the phase error; and phase correction means, coupled to receive the error signal and the feedforward signal, for shifting the phase of the modulated signal in response to the error signal and the feedforward signal to compensate for any shifts in the phase of the output signal.

10. The transmitter of claim 9, further comprising:

an inphase feedback combiner, coupled to the phase detector to receive the detected baseband inphase signal, and coupled to receive the inphase baseband input signal, for combining the inphase baseband feedback signal, out of phase, with the inphase input signal, to provide an inphase difference signal to the modulator; and a quadrature feedback combiner, coupled to the phase detector for combining the quadrature feedback signal, out of phase, with the quadrature input signal to provide a quadrature difference signal to the modulator.

11. The transmitter of claim 10, further comprising:

a soft start means, disposed between the phase correction means and the modulator, for attenuating the inphase baseband input signal and the quadrature baseband input signal at a selected time for a selected period of time.

12. The transmitter of claim 11, wherein the inphase and quadrature combiner means comprise operational amplifiers.

* * * * *